United States Patent
Shibata

(10) Patent No.: US 7,839,686 B2
(45) Date of Patent: Nov. 23, 2010

(54) SEMICONDUCTOR MEMORY DEVICE CAPABLE OF EXECUTING HIGH-SPEED READ

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 673 days.

(21) Appl. No.: 11/737,413

(22) Filed: Apr. 19, 2007

(65) Prior Publication Data
US 2007/0253272 A1 Nov. 1, 2007

(30) Foreign Application Priority Data
Apr. 27, 2006 (JP) .............................. 2006-123919

(51) Int. Cl.
*G11C 16/04* (2006.01)
(52) U.S. Cl. .................... 365/185.17; 365/185.26; 365/185.16
(58) Field of Classification Search ............ 365/185.17, 365/185.33, 185.26
See application file for complete search history.

(56) References Cited

U.S. PATENT DOCUMENTS

| | | | |
|---|---|---|---|
| 5,646,886 A | | 7/1997 | Brahmbhatt |
| 6,301,155 B1 * | | 10/2001 | Fujiwara ................ 365/185.18 |
| 6,657,891 B1 | | 12/2003 | Shibata et al. |
| 6,850,439 B1 * | | 2/2005 | Tanaka ................... 365/185.17 |
| 7,307,332 B2 * | | 12/2007 | Nakagawa ................ 257/500 |
| 7,593,253 B2 * | | 9/2009 | Takemura et al. .......... 365/158 |
| 2005/0254302 A1 * | | 11/2005 | Noguchi ................ 365/185.17 |
| 2006/0133150 A1 | | 6/2006 | Shibata |
| 2009/0279360 A1 * | | 11/2009 | Lee et al. ............... 365/185.17 |

FOREIGN PATENT DOCUMENTS

| JP | 2004-192789 | 7/2004 |
|---|---|---|
| JP | 2006-172630 | 6/2006 |

OTHER PUBLICATIONS

U.S. Appl. No. 12/055,074, filed Mar. 25, 2008, Shibata.

* cited by examiner

*Primary Examiner*—Vu A Le
*Assistant Examiner*—Han Yang
(74) *Attorney, Agent, or Firm*—Oblon, Spivak, McClelland, Maier & Neustadt, L.L.P.

(57) ABSTRACT

A plurality of memory cells are arranged in a memory cell array. The plurality of memory cells are connected to a plurality of word lines and a plurality of bit lines. A plurality of source lines are disposed along the plurality of bit lines. The plurality of source lines are connected respectively to sources of the plurality of memory cells at a time of data read.

7 Claims, 15 Drawing Sheets

Memory cell MC

Select gate

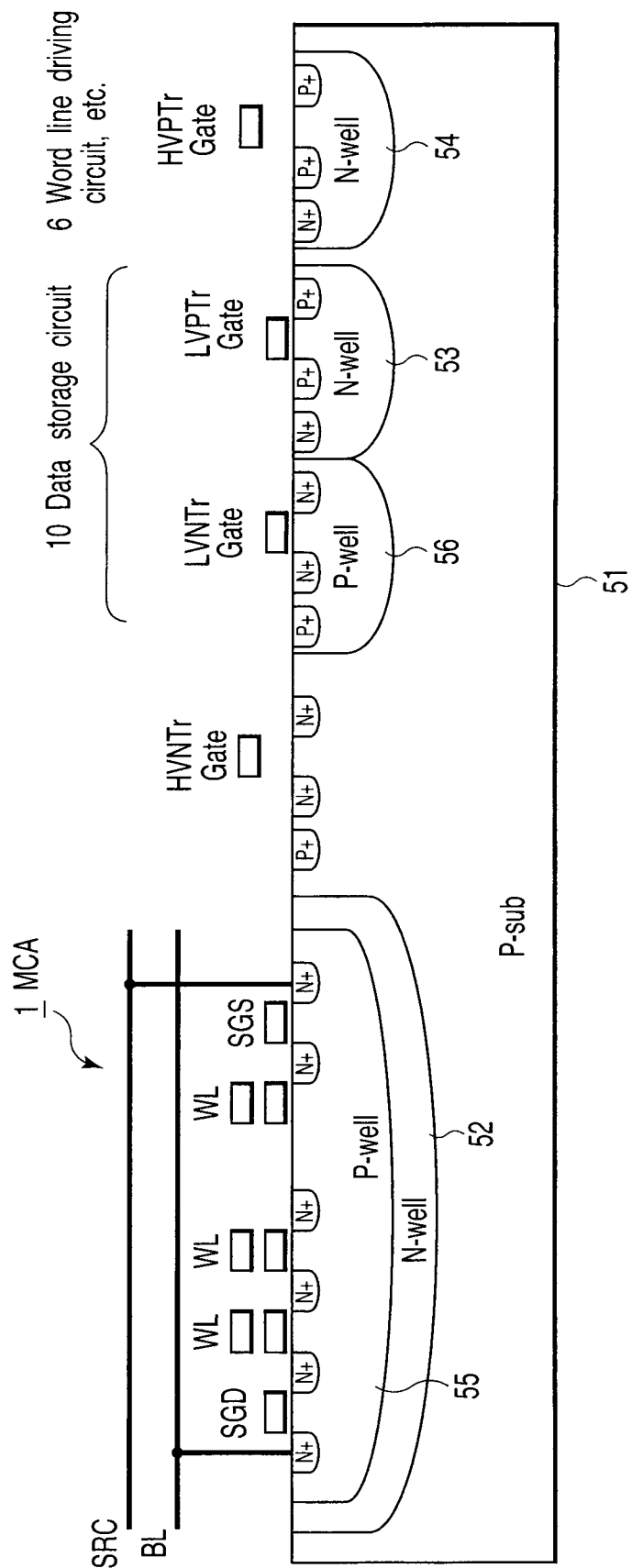
F I G. 4

FIG. 5

| | Cell (P-well) | Cell (N-well) | H.V.Tr (P-sub) | L.V.Nch(P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V)/Vpgmh |
| Read | Vfix (1.6V) | Vfix (1.6V) | Vss (0V) | Vss (0V) | Vdd (2.5V) | Vdd (2.5V)/Vreadh+Vfix |

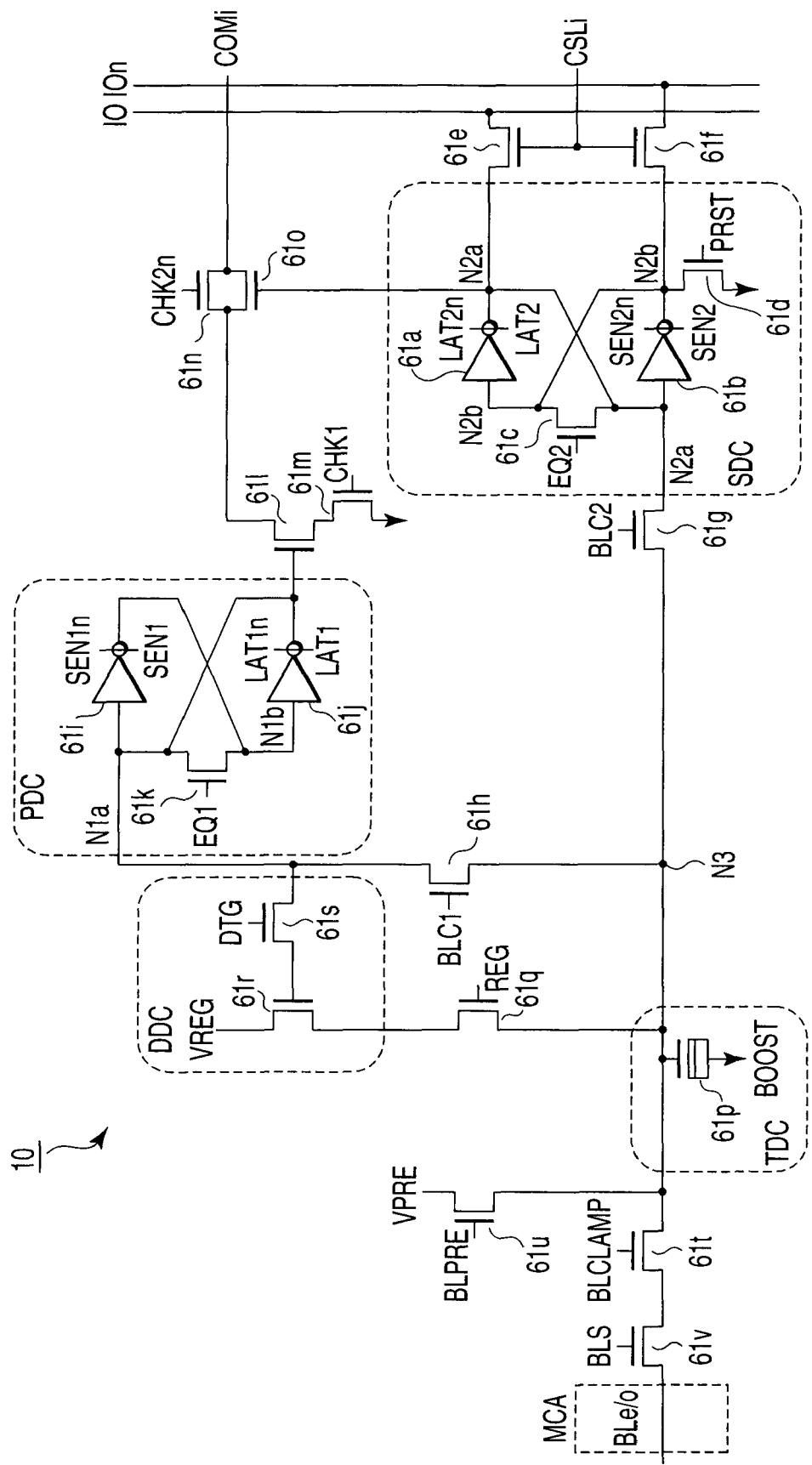
F I G. 6

SEMICONDUCTOR MEMORY DEVICE CAPABLE OF EXECUTING HIGH-SPEED READ

CROSS-REFERENCE TO RELATED APPLICATIONS

This application is based upon and claims the benefit of priority from prior Japanese Patent Application No. 2006-123919, filed Apr. 27, 2006, the entire contents of which are incorporated herein by reference.

BACKGROUND OF THE INVENTION

1. Field of the Invention

The present invention relates to a semiconductor memory device capable of storing, e.g., data of two values or more in one memory cell.

2. Description of the Related Art

For example, in a NAND type flash memory, a plurality of memory cells, which are arranged in a row direction, are connected to latch circuits via bit lines, respectively. Each latch circuit holds data at a time of data write and data read. Batch data write or read is executed in the plural memory cells arranged in the row direction (see, e.g., Jpn. Pat. Appln. KOKAI Publication No. 2004-192789).

In an erase operation, the threshold voltage of the memory cell is made negative. By a write operation, electrons are injected in the floating gate of the memory cell, thereby making the threshold voltage positive. However, since the memory cells are connected in series in the NAND type flash memory, it is necessary that non-selected cells, other than a selected cell, be turned on when data of the selected cell is read to the bit line in a read operation. Thus, a voltage (Vread), which is higher than a maximum threshold voltage set in the memory cell, is applied to the control gates of the non-selected cells.

On the other hand, in the write operation, the threshold voltage set in the memory cell cannot exceed Vread in consideration of the read operation. It is thus necessary to execute, in the write sequence, a control to prevent the threshold voltage of the memory cell from exceeding Vread, by repeatedly executing program and program verify for each bit.

In the meantime, in order to increase memory capacity, a multi-value memory which stores data of two bits or more in one memory cell has been developed. For example, in order to store two bits in one memory cell, it is necessary to set four threshold distributions. Thus, in the case of the multi-value memory, it is necessary to make each threshold distribution narrower than in the case of a memory which stores one bit in one cell. As a result, there is a problem that the write speed decreases.

It is thought that high-speed write is enabled by setting a threshold voltage also on the negative side and increasing the width of each threshold distribution. As a method of setting the threshold voltage on the negative side, it has been proposed to apply a bias voltage to the source of the cell and the well at the time of read and verify read, thereby making the potentials of the source and well higher than the potential of the word line. Thus, it becomes possible to apparently realize an equivalent case in which a negative voltage is applied to the word line, and it becomes possible to read a negative threshold voltage. In the case of this proposed method, the source and well, on the one hand, and the non-selected bit line, on the other hand, are short-circuited so as to prevent a large current from flowing to a power supply circuit, which generates the bias voltage, from many bit lines of, 16K to 32K. In the read operation, a potential is first applied to a selected bit line of two bit lines. At this time, a charge (+Q) is accumulated in the selected bit line, and a charge (−Q) is accumulated in the non-selected bit line. If the cell is turned on, the charge that is accumulated in the selected bit line flows to the source. However, since the source and the well, and the non-selected bit line are short-circuited, the charge of the selected bit line flows to the non-selected bit line, and the charge of the selected bit line is neutralized with the charge (−Q) accumulated in the non-selected bit line and is erased. Accordingly, source noise can be suppressed and high-speed read is enabled. Moreover, since little current flows into the power supply circuit that supplies the bias voltage to the source and well and the non-selected bit line, the power supply circuit stably operates and the threshold voltage on the negative voltage side can be surely read.

In this case, however, since the charge (−Q) accumulated in the non-selected bit line needs to be let to flow to the source line, simultaneous read can be executed from only half the plural cells arranged in the row direction. In the case where only half the plural cells arranged in the row direction can be selected, a write operation is executed in units of half the cells. Consequently, the non-selected cell suffers program disturb. In order to increase the write speed, it is desirable to simultaneously write data in all the plural cells arranged in the row direction. By connecting data storage circuits to all the bit lines, it becomes possible to simultaneously write data in all the cells arranged in the row direction.

However, in the data read operation, as described above, it is necessary to use one of neighboring two bit lines and thereby to erase the charge of the other bit line. As a result, data read can be executed only in units of half the plural cells arranged in the row direction, and read cannot be executed from all the cells at the same time. This data read is not limited to ordinary read, but is similarly applicable to verify read for verifying write data. In particular, in the case of multi-value memories which store 4-value, 8-value and 16-value data, the number of times of verify read increases in order to verify write data. Because of the write time, the time that is needed for the write verify increases. As has been described above, in the case where the bias voltage is applied to the source line at the time of data read, there is the problem that simultaneous data read cannot be executed stably and at high speed from all cells arranged in the row direction, with noise being suppressed. Therefore, there is a demand for the advent of a semiconductor memory device which can simultaneously read data from all cells in the row direction stably and at high speed.

BRIEF SUMMARY OF THE INVENTION

According to a first aspect of the invention, there is provided a semiconductor memory device comprising: a memory cell array in which a plurality of memory cells are arranged, the plurality of memory cells being connected to a plurality of word lines and a plurality of bit lines; and a plurality of source lines which are disposed along the plurality of bit lines, respectively, the plurality of source lines being connected respectively to sources of the plurality of memory cells at a time of data read.

According to a second aspect of the invention, there is provided a semiconductor memory device comprising: a memory cell array in which a plurality of NAND cells are arranged, each of the plurality of NAND cells including a plurality of series-connected memory cells, the plurality of NAND cells having drains connected to bit lines, respectively, and the plurality of memory cells having gate electrodes connected to word lines, respectively; and a plurality of source lines which are disposed along the bit lines, respectively, the plurality of source lines being connected respectively to sources of the plurality of NAND cells at a time of data read.

BRIEF DESCRIPTION OF THE SEVERAL VIEWS OF THE DRAWING

FIG. 4 is a cross-sectional view showing a NAND type flash memory;

FIG. 5 shows examples of voltages that are supplied to respective regions in FIG. 4;

FIG. 6 is a circuit diagram showing an example of a data storage circuit shown in FIG. 1;

DETAILED DESCRIPTION OF THE INVENTION

Embodiments of the present invention will now be described with reference to the accompanying drawings.

First Embodiment

Figure 2:
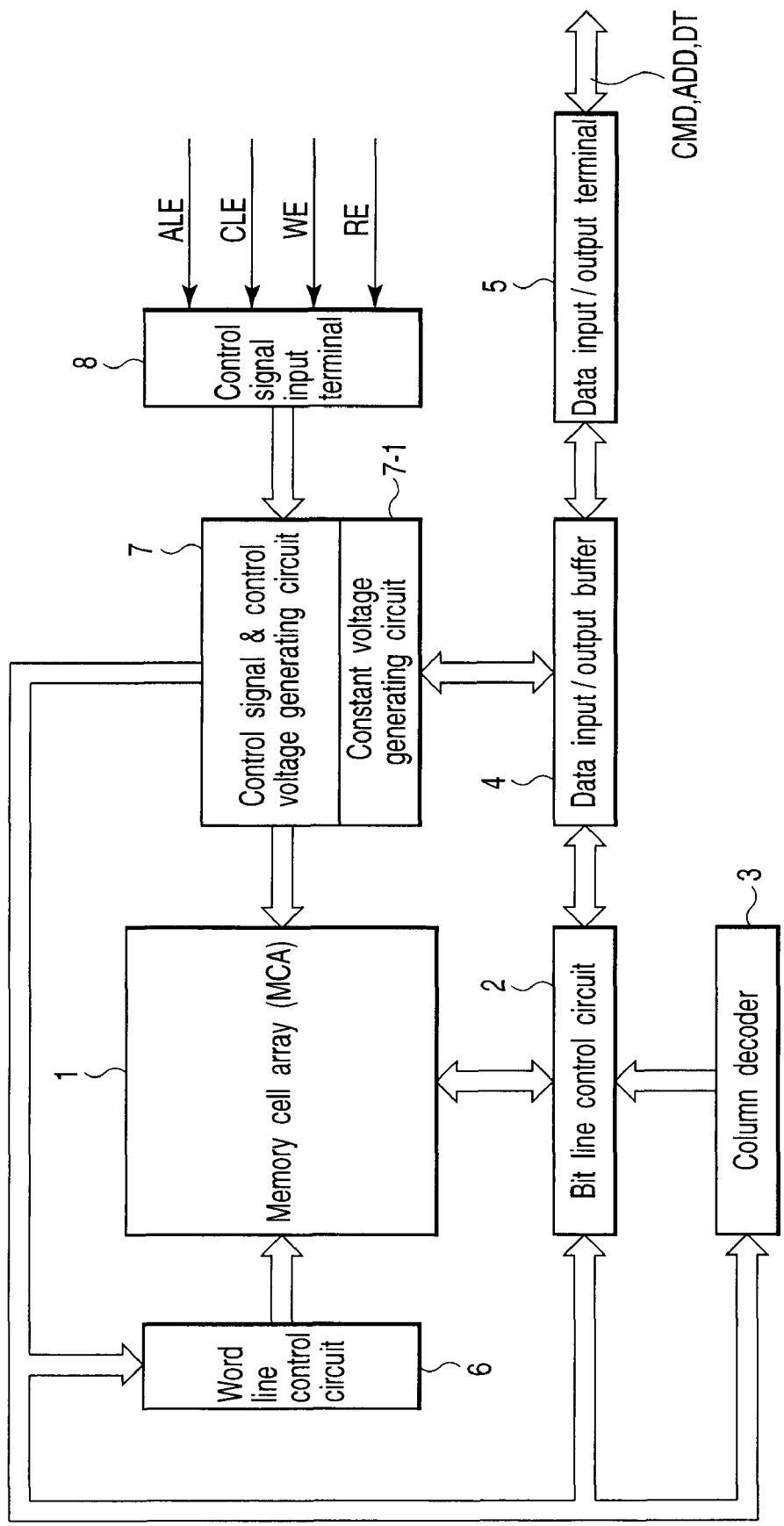
FIG. 2 schematically shows the structure of a semiconductor memory device according to the first embodiment.

FIG. 2 shows the structure of a semiconductor memory device according to a first embodiment of the invention, or, to be more specific, a NAND flash memory which stores, e.g., 4-value (2-bit) data.

A memory cell array 1 includes a plurality of bit lines, a plurality of word lines and a common source line. In the memory cell array 1, memory cells composed of, e.g., EEPROM cells, which can electrically rewrite data, are arranged in a matrix. A bit line control circuit 2 for controlling the bit lines and a word line control circuit 6 are connected to the memory cell array 1.

The bit line control circuit 2 reads data from the memory cells of the memory cell array 1 via the bit lines, detects the states of the memory cells of the memory cell array 1 via the bit lines, and writes data in the memory cells by applying a write control voltage to the memory cells of the memory cell array 1 via the bit lines. A column decoder 3 and a data input/output buffer 4 are connected to the bit line control circuit 2. Data storage circuits in the bit line control circuit 2 are selected by the column decoder 3. The data in the memory cells, which are read to the data storage circuits, are output to the outside from a data input/output terminal 5 via the data input/output buffer 4.

The data input/output terminal 5 receives various commands CMD, addresses ADD and write data DT, which are delivered from, for example, an external host. The write data DT, which is input to the data input/output terminal 5, is input via the data input/output buffer 4 to the data storage circuits which are selected by the column decoder 3.

The word line control circuit 6 is connected to the memory cell array 1. The word line control circuit 6 selects word lines in the memory cell array 1, and applies a voltage necessary for read, write or erase to the selected word lines.

The memory cell array 1, bit line control circuit 2, column decoder 3, data input/output buffer 4 and word line control circuit 6 are connected to a control signal & control voltage generating circuit 7 and are controlled by the signal & control voltage generating circuit 7. The signal & control voltage generating circuit 7 is connected to a control signal input terminal 8 and is controlled by the address latch enable (ALE), command latch enable (CLE), write enable (WE) and read enable (RE) control signals, which are input from outside via the control signal input terminal 8. In accordance with these control signals, the control signal & control voltage generating circuit 7 generates necessary control signals and control voltages at the time of data write, data read and data erase. Further, the control signal & control voltage generating circuit 7 includes a constant voltage generating circuit 7-1 which generates a fixed voltage Vfix (e.g., 1.6 V). When a negative threshold voltage is to be read, the constant voltage generating circuit 7-1 supplies the fixed voltage Vfix to a well, a main source line, a sub-source line and a select gate of a non-selected block, which will be described later. Specifically, a fixed bias voltage is applied to the well, source line, etc., and the potential of the well, source, etc., is set to be higher than the potential of the word line. Thereby, a negative voltage is apparently applied to the word line, and thus the negative threshold voltage, which is set in the memory cell, can be read.

The bit line control circuit 2, column decoder 3, word line control circuit 6 and control signal & control voltage generating circuit 7 constitute a write circuit and a read circuit.

Figure 1:
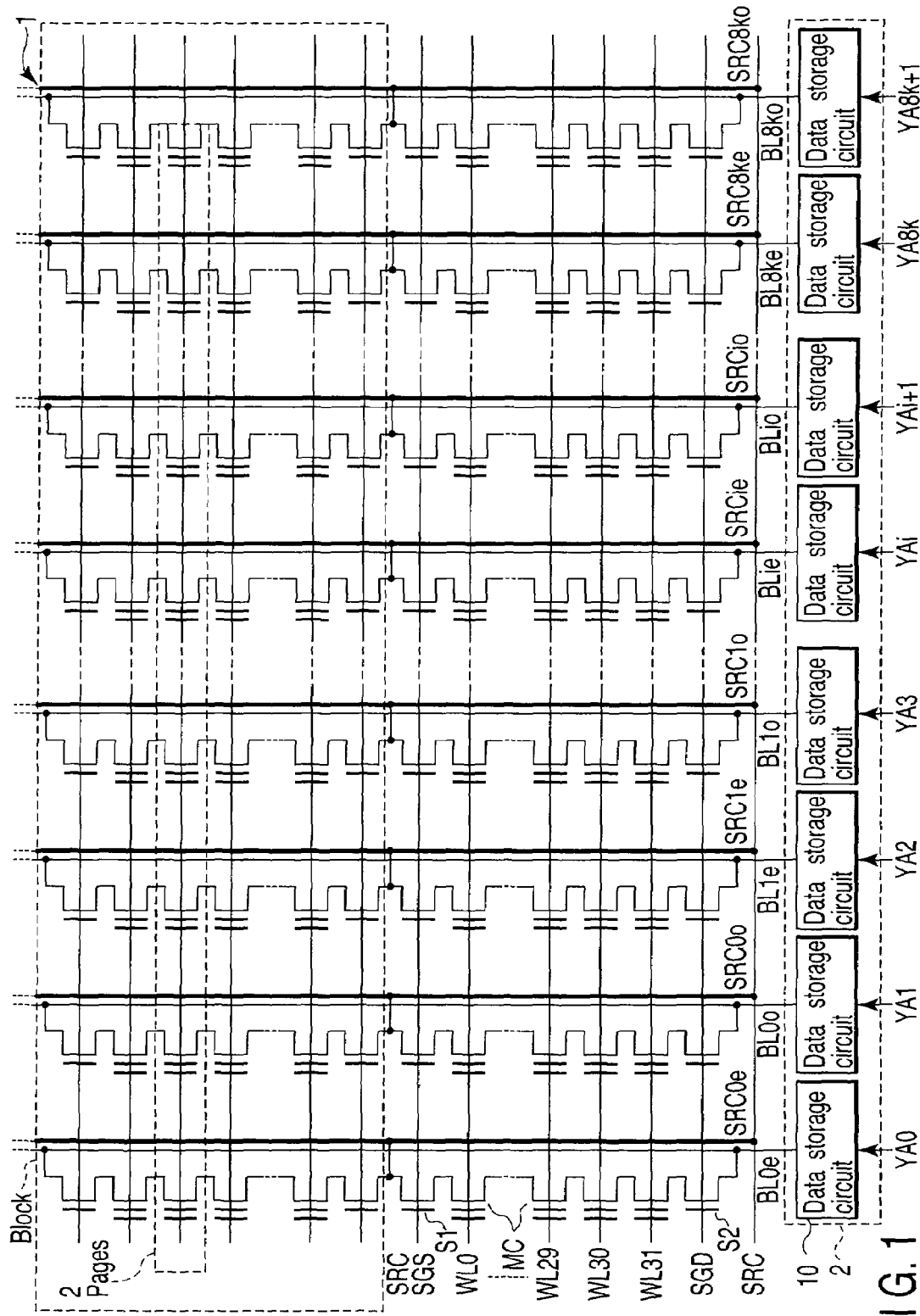
FIG. 1 shows a first embodiment of the present invention, and is a circuit diagram showing a memory cell array.

FIG. 1 shows the structures of the memory cell array 1 and bit line control circuit 2 which are shown in FIG. 2. A plurality of NAND cells are arranged in the memory cell array 1. One NAND cell comprises memory cells MC, which are formed of, e.g., 32 EEPROMs that are connected in series, and select gates S1 and S2. The select gate S2 is connected to a bit line BL0$e$, and the select gate S1 is connected to a sub-source line SRC0$e$.

In the first embodiment, sub-source lines SRC0$e$, SRC0$o$, SRC1$e$, SRC1$o$, . . . , SRC$ie$, SRC$io$, . . . , SRC8$ke$ and SRC8$ko$ are disposed along bit lines BL0$e$, BL0$o$, BL1$e$, BL1o, . . . , BLie, BLio, . . . , BL8ke and BL8ko. One end of each sub-source line is connected to a main source line SRC, and the other end of each sub-source line is connected to the source of each NAND cell via the select gate S1. Each of these sub-source lines SRC0e, SRC0o, SRC1e, SRC1o, . . . , SRCie, SRCio, . . . , SRC8ke and SRC8ko has a function of neutralizing and erasing the charge of the associated bit line at the time of data read. The even-numbered bit lines BL0e to BL8ke and even-numbered sub-source lines SRC0e to SRC8ke and the odd-numbered bit lines BL0o to BL8ko and odd-numbered sub-source lines SRC0o to SRC8ko are alternately arranged.

The control gates of the memory cells MC, which are arranged in each row, are commonly connected to an associated one of word lines WL0 to WL29, WL30 and WL31. The select gates S2 are commonly connected to a select line SGD, and the select gates S1 are commonly connected to a select line SGS.

The bit line control circuit 2 includes the same number of data storage circuits 10 as the number of bit lines. The respective data storage circuits 10 are connected to the bit lines BL0e, BL0o, BL1e, BL1o, . . . , BLie, BLio, . . . , BL8ke and BL8ko. In FIG. 1, all the data storage circuits are disposed on one side of the bit lines. However, if there are severe restrictions on layout, it is possible to dispose, for example, the data storage circuits, which are connected to the even-numbered bit lines BLe, on one side of the bit lines, and to dispose the data storage circuits, which are connected to the odd-numbered bit lines BLo, on the other side of the bit lines, The memory cell array 1 includes a plurality of blocks, as indicated by a broken line. Each of the blocks is composed of a plurality of NAND cells. For example, data is erased in units of one block. In addition, the erase operation is executed at the same time for the bit lines connected to the data storage circuits 10.

A plurality of memory cells connected to one word line (memory cells in the range surrounded by a broken line) constitute one sector. Data is written and read in units of one sector. In the case of the present embodiment, data is written in, and read from, all memory cells connected to one word line.

At the time of a read operation, a program verify operation and a program operation, the bit lines BL0e, BL0o, BL1e, BL1o, . . . , BLie, BLio, . . . , BL8ke and BL8ko, which are connected to the data storage circuits 10, are selected in accordance with address signals YA0, YA1, YA2, YA3, . . . , YAi, YAi+1, . . . , YA8k and YA8k+1. Further, one word line is selected in accordance with an external address.

Figure 3A:
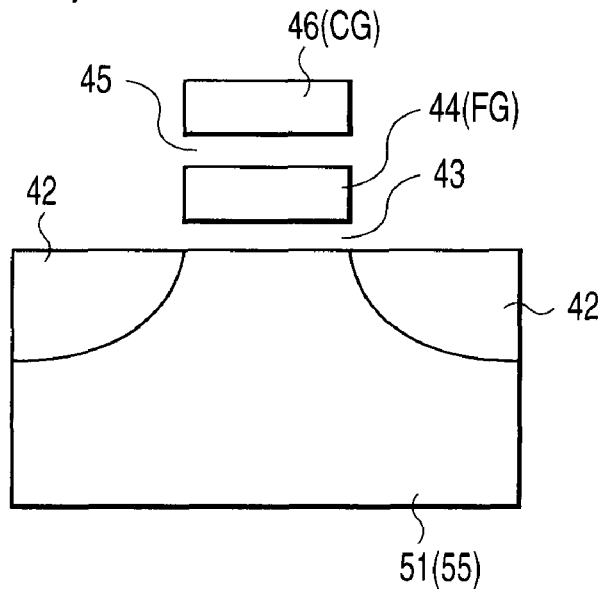
FIGS. 3A and 3B are cross-sectional views showing a memory cell and a select transistor.
Figure 3B:
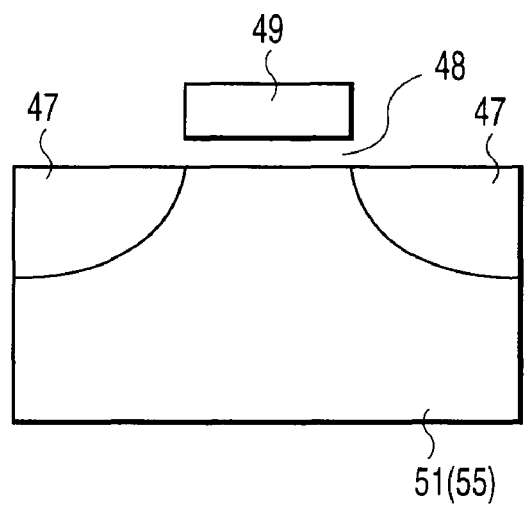

FIGS. 3A, 3B and 4 are cross-sectional views of the memory cell and select transistor.

FIGS. 3A and 3B show cross sections of the memory cell and select transistor. FIG. 3A shows the memory cell. In a substrate 51 (a P-type well region 55 to be described later), n-type diffusion layers 42, which function as the source and drain of the memory cell, are formed. A floating gate (FG) 44 is formed on the P-type well region 55 via a gate insulation film 43. A control gate (CG) 46 is formed on the floating gate 44 via an insulation film 45. FIG. 3B shows the select gate. In a P-type well region 55, n-type diffusion layers 47, which function as the source and drain, are formed. A control gate 49 is formed on the P-type well region 55 via a gate insulation film 48.

FIG. 4 is a cross-sectional view of the semiconductor memory device according to the first embodiment. For example, N-type well regions 52, 53 and 54 and P-type well regions 55 and 56 are formed in the P-type semiconductor substrate 51. The P-type well region 55 is formed in the N-type well region 52, and low-voltage N-channel transistors LVNTr, which constitute the memory cell array 1, are formed in the P-type well region 55. Further, a low-voltage P-channel transistor LVPTr and a low-voltage N-channel transistor LVNTr, which constitute the data storage circuit 10, are formed in the N-type well region 53 and P-type well region 56. A high-voltage N-channel transistor HVNTr, which connects the bit line and the data storage circuit 10, is formed in the substrate 51. In addition, a high-voltage P-channel transistor HVPTr, which constitutes, e.g., a word line driving circuit, is formed in the N-type well region 54. As shown in FIG. 4, the high-voltage transistor HVNTr, HVPTr has, for example, a thicker gate insulation film than the low-voltage transistor LVNTr, LVPTr. Similarly, the peripheral circuits 2 to 8 in FIG. 2 are formed of transistors LVNTr, LVPTr, HVNTr and HVPTr.

FIG. 5 shows voltages which are supplied to the respective parts shown in FIG. 4 at the time of erase, program and read. At the time of data read, a fixed voltage Vfix is supplied to the N-well 52 and P-well 55 in which the memory cells are formed. The fixed voltage Vfix is Vfix=0V in a case where a negative-side threshold level, other than an erase level, is not provided.

FIG. 6 is a circuit diagram showing an example of the data storage circuit 10 shown in FIG. 1.

The data storage circuit 10 includes a primary data cache (PDC), a secondary data cache (SDC), a dynamic data cache (DDC), and a temporary data cache (TDC). The SDC, PDC and DDC hold input data at the time of write, hold read data at the time of read, temporarily hold data at the time of verify, and are used to handle internal data at the time of storing multi-value data. The TDC amplifies and temporarily stores data of the bit line at the time of data read, and is used to handle internal data at the time of storing multi-value data.

The SDC is composed of clocked inverter circuits 61a and 61b which constitute a latch circuit, and transistors 61c and 61d. The transistor 61c is connected between an input terminal of the clocked inverter circuit 61a and an input terminal of the clocked inverter circuit 61b. The gate of the clocked inverter circuit 61c is supplied with a signal EQ2. The transistor 61d is connected between an output terminal of the clocked inverter circuit 61b and a ground. The gate of the transistor 61d is supplied with a signal PRST. A node N2a of the SDC is connected to an input/output data line IO via a column select transistor 61e, and a node N2b of the SDC is connected to an input/output data line IOn via a column select transistor 61f. The gates of the transistors 61e and 61f are supplied with a column select signal CSLi. A node N2a of the SDC is connected to a node N1a of the PDC via transistors 61g and 61h. The gate of the transistor 61g is supplied with a signal BLC2, and the gate of the transistor 61h is supplied with a signal BLC1.

The PDC is composed of clocked inverter circuits 61i and 61j and a transistor 61k. The transistor 61k is connected between an input terminal of the clocked inverter circuit 61i and an input terminal of the clocked inverter circuit 61j. The gate of the transistor 61k is supplied with a signal EQ1. A node N1b of the PDC is connected to the gate of a transistor 61l. One end of the current path of the transistor 61l is grounded via a transistor 61m. The gate of the transistor 61m is supplied with a signal CHK1. The other end of the current path of the transistor 61l is connected to one end of a current path of transistors 61n and 61o which constitute a transfer gate. The gate of the transistor 61n is supplied with a signal CHK2n. The gate of the transistor 61o is connected to the node N2a. The other end of the current path of the transistors 61n and 61o is connected to a signal line COMi. The signal line COMi is commonly connected to all the data storage circuits 10. On the basis of the level of the signal line COMi, it can be determined whether the verify operation of all the data storage circuits 10 has been completed. Specifically, as will be described later, if the verify operation is completed, the node N1b of the PDC is made low. In this state, if the signals CHK1 and CHK2n are made high, the signal line COMi goes high in the case where the very operation is completed.

Further, the TDC is composed of, e.g., a MOS capacitor 61p. One end of the capacitor 61p is connected to a connection node N3 between the transistors 61g and 61h, and the other end of the capacitor 61p is supplied with a signal BOOST (to be described later). In addition, the DDC is connected to the connection node N3 via a transistor 61q. The gate of the transistor 61q is supplied with a signal REG.

The DDC is composed of transistors 61r and 61s. One end of a current path of the transistor 61r is supplied with a signal VREG, and the other end of the current path of the transistor 61r is connected to the current path of the transistor 61q. The gate of the transistor 61r is connected to the node N1a of the PDC via the transistor 61s. The gate of the transistor 61s is supplied with a signal DTG.

Furthermore, one end of the current path of each of transistors 61t and 61u is connected to the connection node N3. The other end of the current path of the transistor 61u is supplied with a signal VPRE, and the gate of the transistor 61u is supplied with a signal BLPRE. The gate of the transistor 61t is supplied with a signal BLCLAMP. The other end of the current path of the transistor 61t is connected to one end of the bit line BLe or BLo via a transistor 61v.

The above-described signals and voltages are generated by the control signal & control voltage generating circuit 7 shown in FIG. 2. Under the control of the control signal & control voltage generating circuit 7, the operation to be described below is controlled.

The present memory is a multi-value memory, and is capable of storing, e.g., 2-bit data in one cell. The switching of the 2 bits is executed by an address (first page, second page).

Figure 7:
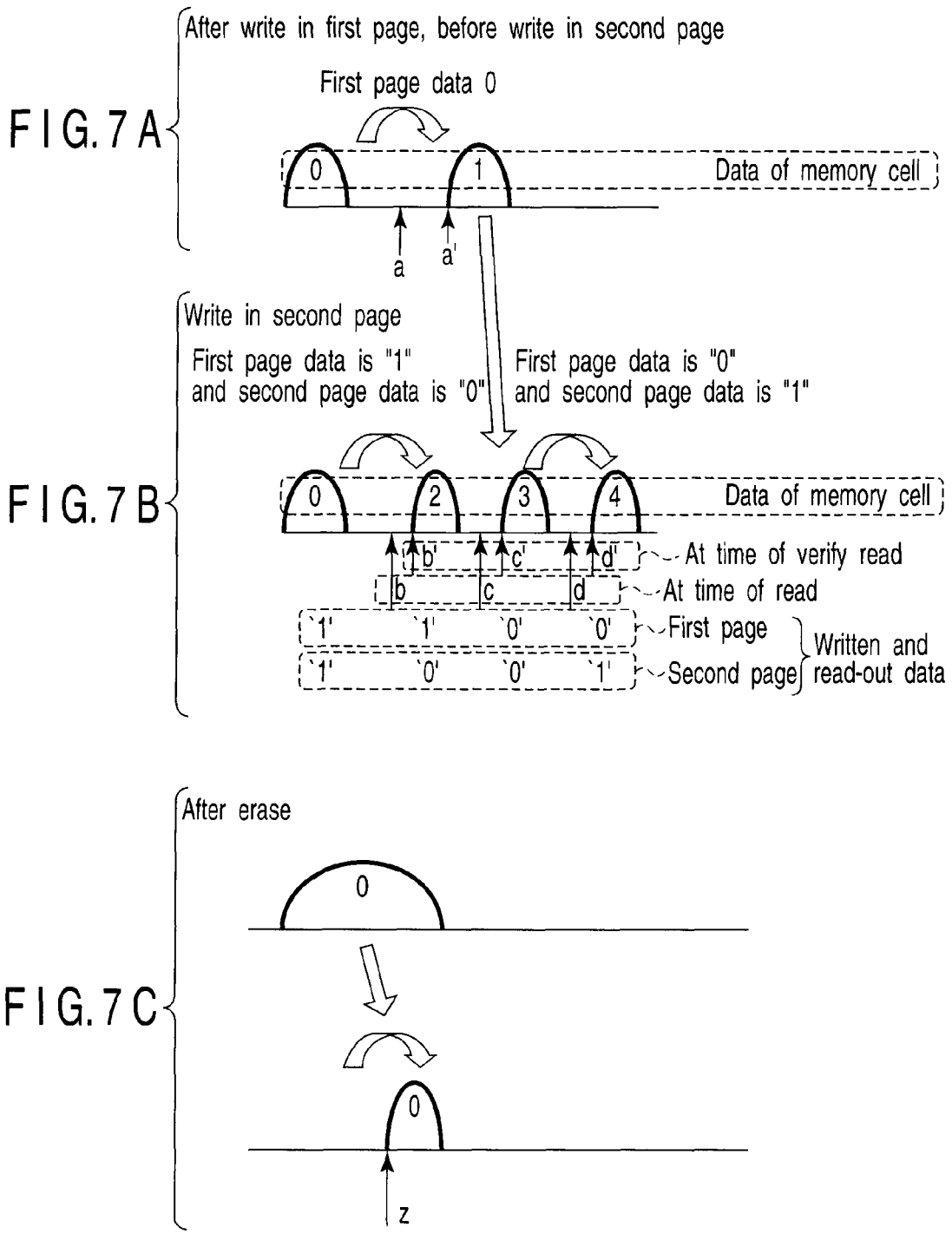
FIGS. 7A, 7B and 7C show threshold voltage distributions of a memory cell at times when a write operation and an erase operation are executed.

FIGS. 7A, 7B and 7C show the relationship between the data of the memory cell and the threshold voltage of the memory cell. If an erase operation is executed, the data of the memory cell becomes "0", as shown in FIGS. 7A and 7C. After the completion of data write of the first page, the data of the memory cell becomes data "0" or data "1". The data "0" has a negative threshold voltage, and the data "1" has a positive threshold voltage.

As shown in FIG. 7B, after the completion of data write of the second page, the data of the memory cell becomes "0", "2", "3" and "4". In the first embodiment, the data of the memory cell are defined from the low threshold voltage to the high threshold voltage.

Figure 8:
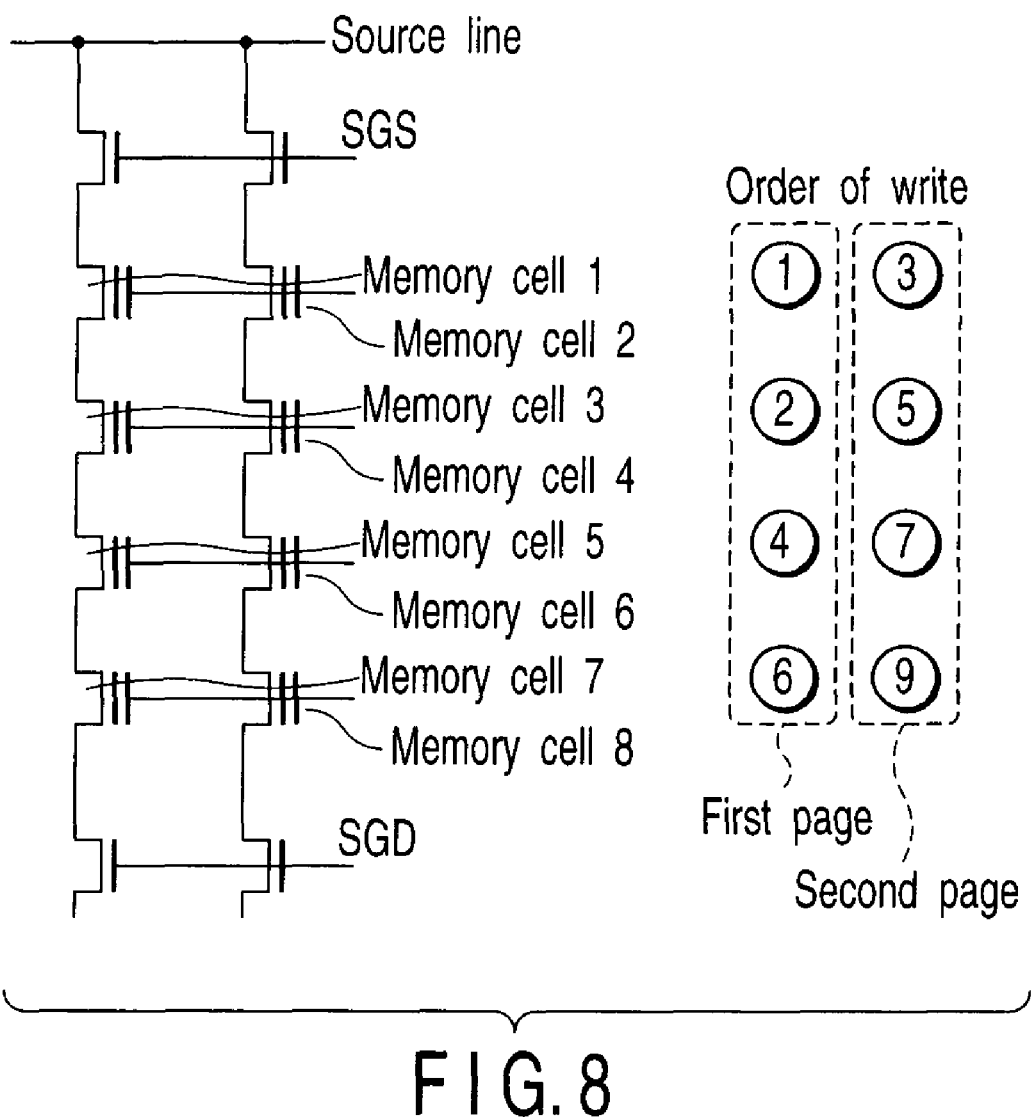
FIG. 8 shows the order of a write operation in NAND cells.

FIG. 8 shows an example of the order of the write operation in the first embodiment. In the block, the write operation is performed on a page-by-page basis from the memory cell that is closest to the source line. Data write is simultaneously executed in the memory cell 1 and memory cell 2, data write is simultaneously executed in the memory cell 3 and memory cell 4, data write is simultaneously executed in the memory cell 5 and memory cell 6, and data write is simultaneously executed in the memory cell 7 and memory cell 8. The order of data write is as follows:

(1) First page of memory cell 1, 2.
(2) First page of memory cell 3, 4.
(3) Second page of memory cell 1, 2.
(4) First page of memory cell 4, 5.
(5) Second page of memory cell 3, 4.
(6) First page of memory cell 7, 8.
(7) Second page of memory cell 5, 6.
(8) Other memory cells not shown.
(9) Second page of memory cell 7, 8.

(Read Operation)

As is shown in FIG. 7A, after the data write in the first page is completed, the data in the memory cell is "0" or "1". Thus, by setting the potential difference between the word line and source line at an intermediate potential "a" of the threshold voltage of these data, the read operation is executed. Thereby, these data can be read. In addition, as shown in FIG. 7B, after the data write in the second page is completed, the data in the memory cell is one of "0", "2", "3" and "4". Thus, by setting the potential difference between the word line and source line at "b", "c" or "d", these data can be read.

Figure 9:
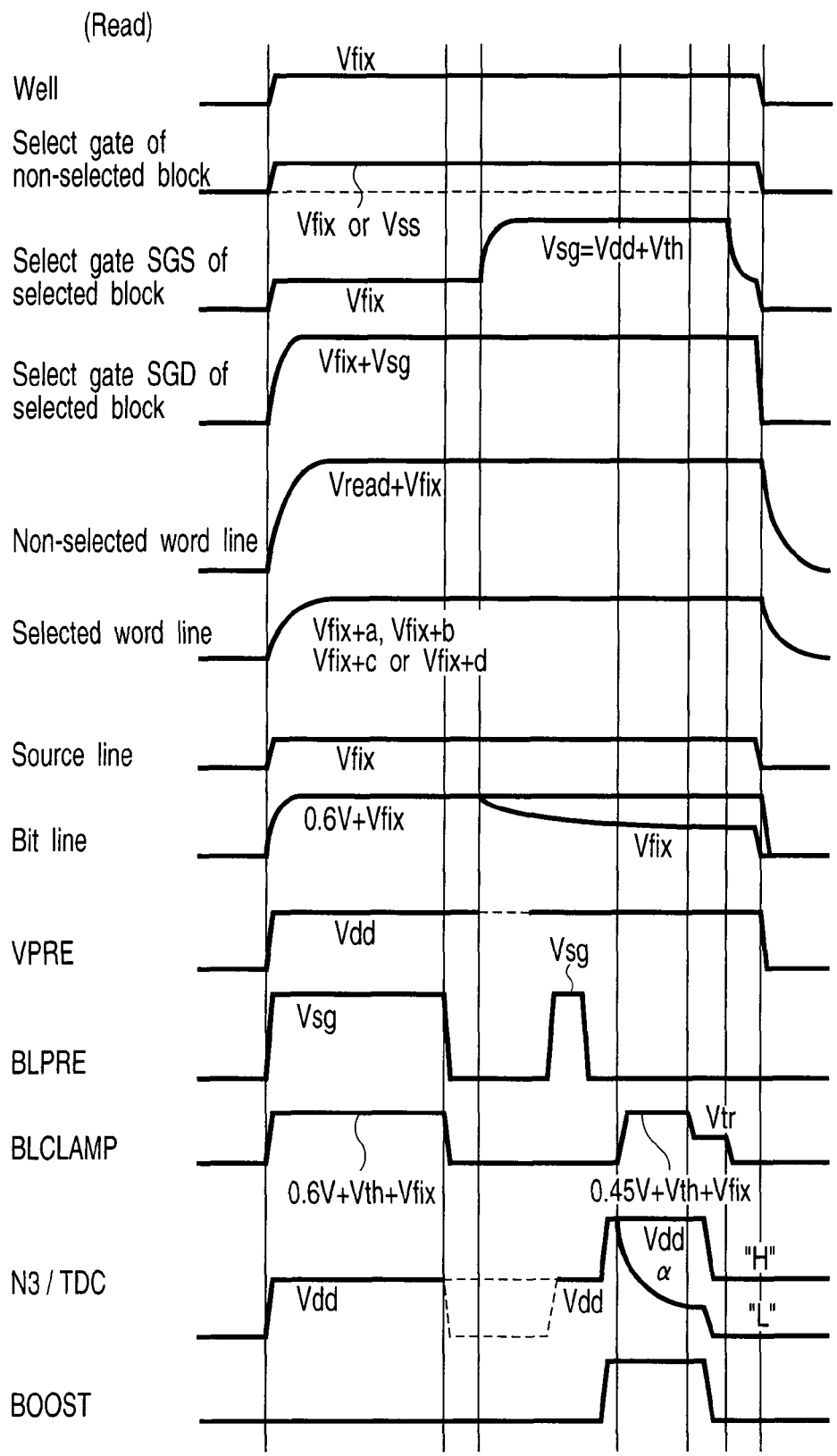
FIG. 9 shows waveforms relating to the read operation of the circuit shown in FIG. 1.

Referring now to FIG. 9, the read operation is explained. In the read operation, a voltage Vfix (e.g., 1.6 V) is supplied from the constant voltage generating circuit 7-1 to the well of the selected cell, the main source line SRC, the sub-source lines SRC0e, ..., SRC8ko, and the select gate of the non-selected block. In the case of the structure in which a threshold distribution is not set on the negative voltage side, Vfix is set at 0 V.

The voltage at the time of read, Vfix+"a", "b", "c" or "d", is supplied to the selected word line. For example, when "a"=−0.5 V, Vfix+"a" is 1.1 V. At the same time, Vread+Vfix is supplied to the non-selected word line of the selected block, Vsg+Vfix (Vsg=Vdd+Vth; Vdd is, e.g., 2.5 V, Vth is a threshold voltage of the N-channel MOS transistor) is supplied to the select line SGD of the selected block, and Vfix is supplied to the select line SGS.

Further, the signal VPRE in the data storage circuit 10 shown in FIG. 6 is set at Vdd, the signal BLPRE is set at Vsg, the signal BLCLAMP is set at, e.g., 0.6 V+Vth+Vfix, and the bit line is precharged at, e.g., 0.6 V+Vfix=2.2 V.

Next, the select line SGS on the source side of the cell is set at Vsg+Vfix. Since the well, the main source line SRC and the sub-source lines SRC0e, ..., SRC8ko are set at voltage Vfix, the cell is off when the threshold voltage of the cell is higher than "a"=−0.5 V, or "b", "c" or "d". Thus, the bit line potential remains high, e.g., 2.2 V. When the threshold voltage of the cell is lower than "a", or "b", "c" or "d", the cell is on. Thus, the charge of the bit line is released, and the potential of the bit line becomes equal to the potential of the main source line and sub-source lines, i.e., Vfix (e.g., 1.6 V). As shown in FIG. 1, the number of bit lines is, e.g., 16K. If the charge Q that is released from each bit line flows into the constant voltage generating circuit 7-1, the constant voltage generating circuit 7-1 would become unstable.

Figure 10:
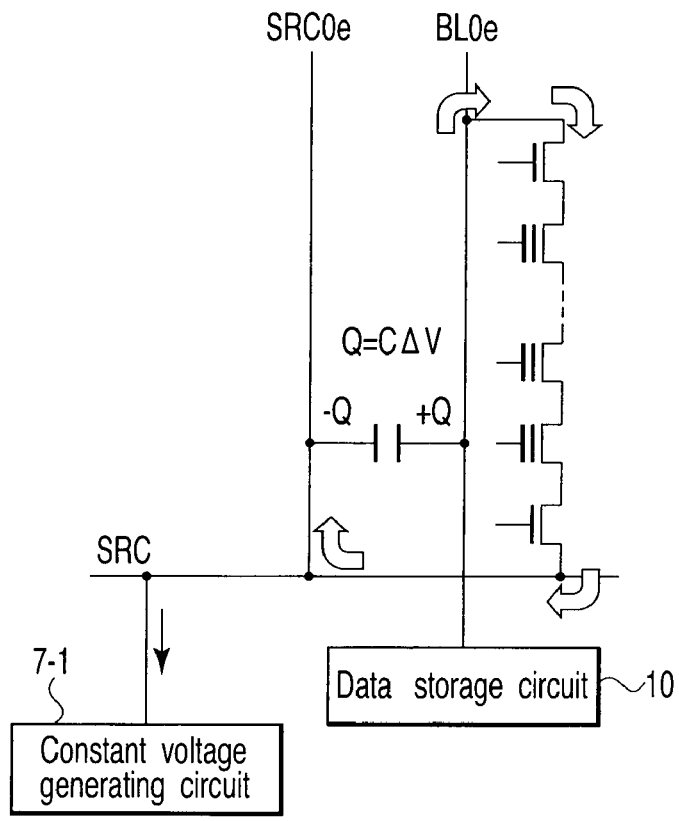
FIG. 10 schematically illustrates the read operation according to the first embodiment.

However, as shown in FIG. 10, the charge (+Q) that is precharged to, e.g., the bit line BL0e flows to the sub-source line SRC0e, and is neutralized with the charge (−Q) of the sub-source line SRC0e and is erased. It is thus possible to prevent a large current from flowing into the constant voltage generating circuit 7-1.

Thereafter, the signal BLPRE in the data storage circuit 10 shown in FIG. 6 is temporarily set at Vsg and the node N3 of the TDC is precharged to Vdd. Then, the signal BOOST is made high, and the potential of the node N3 of the TDC is set at αVdd (e.g., α=1.7, and αVdd=4.25 V).

Subsequently, the signal BLCLAMP is set at, e.g., a voltage (0.45 V+Vth)+Vfix. When the bit line potential is lower than 0.45 V+Vfix (Vfix=e.g., 1.6 V), the node N3 of the TDC is made low. When the bit line potential is higher than 0.45 V, the node N3 of the TDC remains high (αVdd=e.g., 4.25 V).

Then, after the signal BLCLAMP is set at voltage Vtr (e.g., 0.1 V+Vth), the signal BOOST is made low. In the case where the node N3 of the TDC is high, the level drops from Vfix (e.g., 1.6 V). Since the signal BLCLAMP is at voltage Vtr (e.g., 0.1 V+Vth), the level does not drop from 0.1 V. In the case where the node N3 of the TDC is high (αVdd=e.g., 4.25 V), the level drops to Vdd.

The signal BLC1 is set at Vsg, and the potential of the TDC is read into the PDC. Thus, when the threshold voltage of the cell is lower than "a", or "b", "c" or "d", the PDC is made low, and when the threshold voltage of the cell is higher than "a", or "b", "c" or "d", the PDC is made high, and the read operation is executed. In this manner, the negative threshold voltage can be read without making the word line voltage negative.

(Program and Program Verify)

(Program)

Figure 11:
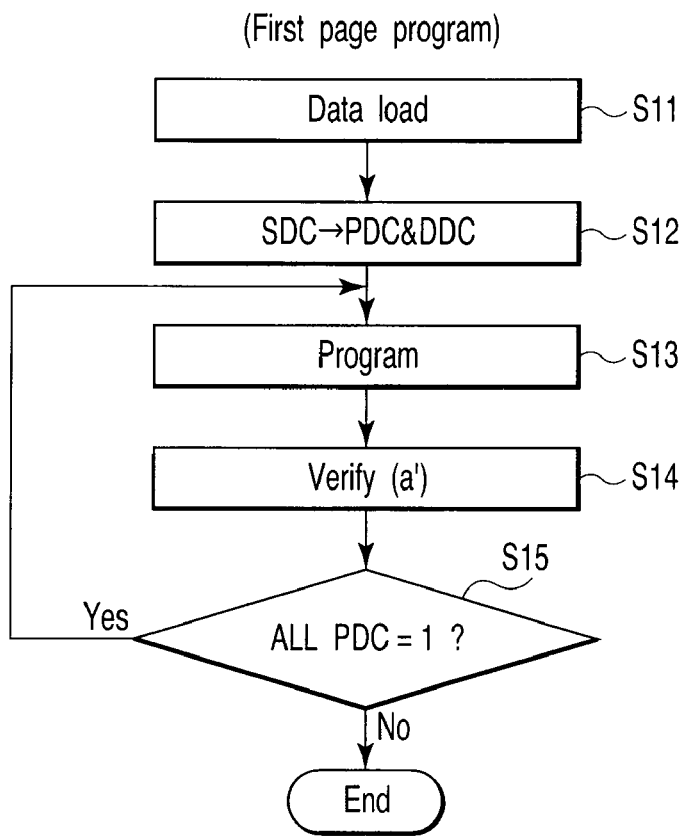
FIG. 11 is a flowchart illustrating a write operation of a first page.

FIG. 11 shows a flowchart of a program operation.

In the program operation, addresses are first designated, and two pages shown in FIG. 1 are selected. In the present memory, the program operation is executed only in the order of the first page and second page of these two pages. Thus, the first page is first selected by the address.

Subsequently, write data is input from outside and is stored in the SDCs (shown in FIG. 6) in all the data storage circuits 10 (S11). If a write command is input, the data in the SDC in each of all the data storage circuits 10 is transferred to the PDC (S12). If data "1" (no data write is executed) is input from outside, the node N1a of the PDC of the data storage circuit 10 goes high. If data "0" (data write is executed) is input, the node Na1 is made low. Subsequently, the data of the PDC is set at the potential of the node N1a, and the data of the SDC is set at the potential of the node N2a.

(Program Operation) (S13)

The signal BLC1 shown in FIG. 6 is set at Vdd+Vth. When data "1" (no data write is executed) is stored in the PDC, the bit line is set at Vdd. When data "0" (data write is executed) is stored in the PDC, the bit line is set at Vss. If Vdd is applied to the select line SGS of the selected block, Vpgm (20 V) is applied to the selected word line and Vpass (10 V) is applied to the non-selected word line, the channel of the cell is set at Vss and the word line is set at Vpgm in the case where the bit line is set at Vss. Thus, data write is executed. On the other hand, in the case where the bit line is set at Vdd, the potential of the channel of the cell is not Vss and goes high due to coupling by increasing Vpgm or Vpass. Thus, data program is not executed. By the data write in the first page, the data in the memory cell becomes data "0" and data "1", as shown in FIG. 7A.

(Program Verify Read) (S14)

In the memory cell, program verify for the first page is executed at level "a". The program verify operation is substantially the same as the read operation.

To begin with, a voltage Vfix (e.g., 1.6 V) is supplied from the constant voltage generating circuit 7-1 to the well of the selected cell, the main source line SRC, the sub-source lines SRC0e to SRC8ko and the select line of the non-selected block. A potential Vfix+a', which is slightly higher than the potential Vfix+a at the time of data read, is supplied to the selected word line. For example, if "a'"=−0.4 V, Vfix+a' is 1.2 V. In the description below, the symbol "'" indicates the verify potential, which is slightly higher than the read potential.

With the application of the potential Vfix+a' to the selected word line at the time of verify read, a negative potential is apparently applied to the gate of the cell. At the same time, Vread+Vfix is supplied to the non-selected word line of the selected block, Vsg+Vfix is supplied to the select line SGD of the selected block, and Vfix is supplied to the select line SGS. Vfix is supplied to the main source line SRC and the sub-source lines SRC0e to SRC8ko, and Vfix is also supplied to the well of the cell. Subsequently, the signal VPRE in the data storage circuit 10 shown in FIG. 6 is set at Vdd (e.g., 2.5 V), the signal BLPRE is set at Vsg, and the signal BLCLAMP is set at, e.g., (0.6 V+Vth)+Vfix. Thus, the bit line is precharged at, e.g., 0.6 V+Vfix=2.2 V. Next, the select line SGS on the source side of the cell is set at Vsg+Vfix. Since the well, main source line SRC and sub-source lines SRC0e to SRC8ko are set at Vfix, the cell is off when the threshold voltage is higher than a' (e.g., a'=−0.4 V). Thus, the bit line remains high (e.g., 2.2 V). In addition, in the case where the threshold voltage of the cell is lower than a', the cell is turned on. Accordingly, the bit line is discharged and set at the same potential as the main source line SRC and sub-source lines SRC0e to SRC8ko, that is, Vfix (e.g., 1.6 V). During the discharge time of the bit line, the signal VPRE is set at VPRE=Vss, the signal BLPRE is set at BLPRE=Vsg, and the TDC is set at Vss. Thereafter, the signal VREG is set at VREG=Vdd and the signal REG is set at REG=Vdd, and the TDC is made high when the DDC is high. Subsequently, the signal DTG is set at Vsg, and the data of the PDC is copied to the DDC. Subsequently, the signal BLC1 is set at BLC1=Vsg, and the potential of the TDC is shifted to the PDC. By these operations, the data of the DDC and the data of the PDC are exchanged.

Following the above, the signal BLPRE in the data storage circuit 10 shown in FIG. 6 is temporarily set at Vsg=(Vdd+Vth), and the node N3 of the TDC is precharged at Vdd. Next, the signal BOOST is made high, and the TDC is set at TDC=αVdd (e.g., α=1.7, αVdd=4.25 V). At this time, the signal BLCLAMP is set at, e.g., (0.45 V+Vth)+Vfix. When the bit line potential is lower than 0.45 V+Vfix, the node N3 of the TDC is made low (Vfix [e.g., 1.6 V]). When the bit line potential is higher than 0.45 V, the node N3 of the TDC remains high (αVdd [e.g., 4.25 V]). Then, after the signal BLCLAMP is set at Vtr (e.g., 0.1 V+Vth), the signal BOOST made low. At this time, the potential of the node N3 of the TDC drops from Vfix (e.g., 1.6 V) in the case of low level, but the potential of the node N3 does not become lower than 0.1 V since the signal BLCLAMP is set at Vtr (e.g., 0.1 V+Vth). In addition, in the case of high level, the potential of the node N3 of the TDC is set to Vdd from (αVdd [e.g., 4.25 V]). At this time, the signal BLC1 is set at Vsg, and the potential of the TDC is read into the PDC. Next, the signal VREG is set at VREG=Vdd and the signal REG is set at REG=Vsg, and the TDC is forcibly made high when the DDC is high (no data write). However, in the case where the DDC is low (no data write), the value of the TDC is unchanged. Accordingly, in the case where the PDC is originally set at PDC=low level (data write), if the threshold value of the cell is lower than level "a'", the PDC goes low (data write) once again. If the threshold value of the cell is higher than level "a'", the PDC goes high and is set in the non-write state in the next program operation. In the case where the PDC is originally set at PDC=high level (no data write), the PDC is set at PDC=high level and is set in the non-write state in the next program loop. This operation is repeated until the PDCs of all data storage circuits 10 are made high ("1") (S15 to S13).

Figure 12:
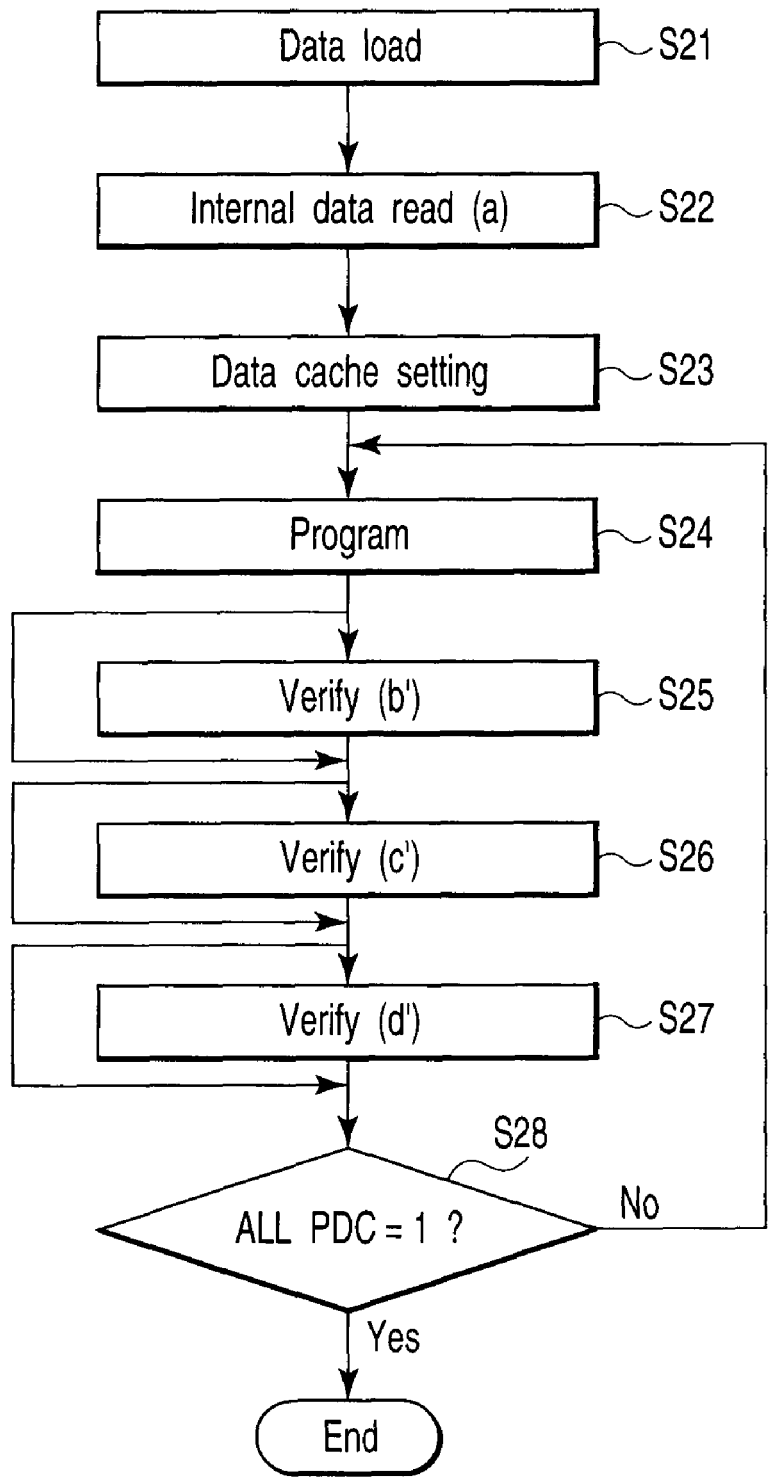
FIG. 12 is a flowchart illustrating a write operation of a second page.

On the other hand, FIG. 12 illustrates the write operation of the second page. In the write operation of the second page, data to be written is first input from outside, and the input data is stored in the SDCs of all data storage circuits 10 (S21).

(Internal Data Read) (S22)

To begin with, prior to data write in the cell, an internal read operation is executed in order to determine whether the data in the memory cell of the first page is "0" or "2". The internal read operation is similar to the above-described negative level read, and a data read operation is executed by supplying a potential of level "a" to the word line.

(Setting of Data Cache) (S23)

Subsequently, the data stored in each data cache is handled. Specifically, the data in the SDC is transferred to the PDC, and the data in the PDC is transferred to the DDC. Next, the data in the DDC is inverted and transferred to the SDC. Then, the data in the PDC is transferred to the DDC. Subsequently, the data in the DDC is inverted and transferred to the PDC. Thereafter, the data in the PDC is transferred to the DDC. By executing these operations, the PDC, DDC and SDC are all made high in the case where the data in the memory cell is to be set at "0" (data "1" in the first page; data "1" in the second page).

In the case where the data in the memory cell is to be set at "1" (data "1" in the first page; data "0" in the second page), the PDC is made low, the DDC is made low and the SDC is made high.

In the case where the data in the memory cell is to be set at "2" (data "0" in the first page; data "0" in the second page), the PDC is made low, the DDC is made high and the SDC is made low.

In the case where the data in the memory cell is to be set at "3" (data "0" in the first page; data "1" in the second page), the PDC, DDC and SDC are all made low.

In the state in which the respective caches are set as described above, the program operation in the second page is executed in the same manner as in the first page (S24).

Thereafter, using levels "b'", "c'" and "d'", the program verify is executed in the same manner as with level "a'" (S25 to s28, S24).

If the above-described operation is executed in the program verify at level "b'", the write cells with levels "c'" and "d'" are determined to be non-write cells in the program verify at level "b'". Thus, for example, in the case of the write operation with levels "c'" and "d'", the node N2a of the SDC is made low. In the case of the write operation with level "b'", since the node N2a of the SDC is high, the TDC is forcibly made high in normal cases by setting the signal VPRE at VPRE=Vdd and setting the signal BLPRE at BLPRE=Vsg. In this case, however, the signal BLPRE is set to remain at Vss, and the signal BLC2 is set at BLC2=Vsg. In the case of the write operation with levels "c'" and "d'", the TDC is made low. The TDC is made high only in the case of the write operation at level "b'". As a result, in the case of the write operation with levels "c'" and "d'", write completion is not determined in the program verify.

In the write operation in the second page, if the above-described operation is executed in the program verify at level "c'", write completion of the write cell at level "d'" is determined in the program verify at level "c'". Thus, after the signal BOOST is made low, the signal VREG is set at VREG=Vdd and the signal REG is set at REG=Vsg. In the case where the DDC is high, the signal BLC1 is set at BLC1=Vtr (=0.1 V+Vth) before the operation for forcibly making the TDC high is executed. In this case, during the discharge of the bit line, the data of the DDC and the data of the PDC are exchanged. Hence, in the case of the write operation at level "c'", the node N1a of the PDC is made high. In the case of the write operation with other levels, the node N1a of the PDC is made low. Accordingly, in cases other than the case of the write operation at level "c'", the TDC is forcibly made low. As a result, in the case of the write operation at "d'", write completion is not determined in the program verify.

In the case where the PDC is low, the write operation is executed once again, and the above-described program operation and verify operation are repeated until the data of the PDCs in all data storage circuits 10 are made high (S25 to S28, S24).

(Erase Operation)

The erase operation is executed in units of the block indicated by the broken line in FIG. 1. After data erase, the threshold voltage distribution of the cell becomes data "0", as shown in FIG. 7C.

Figure 13:
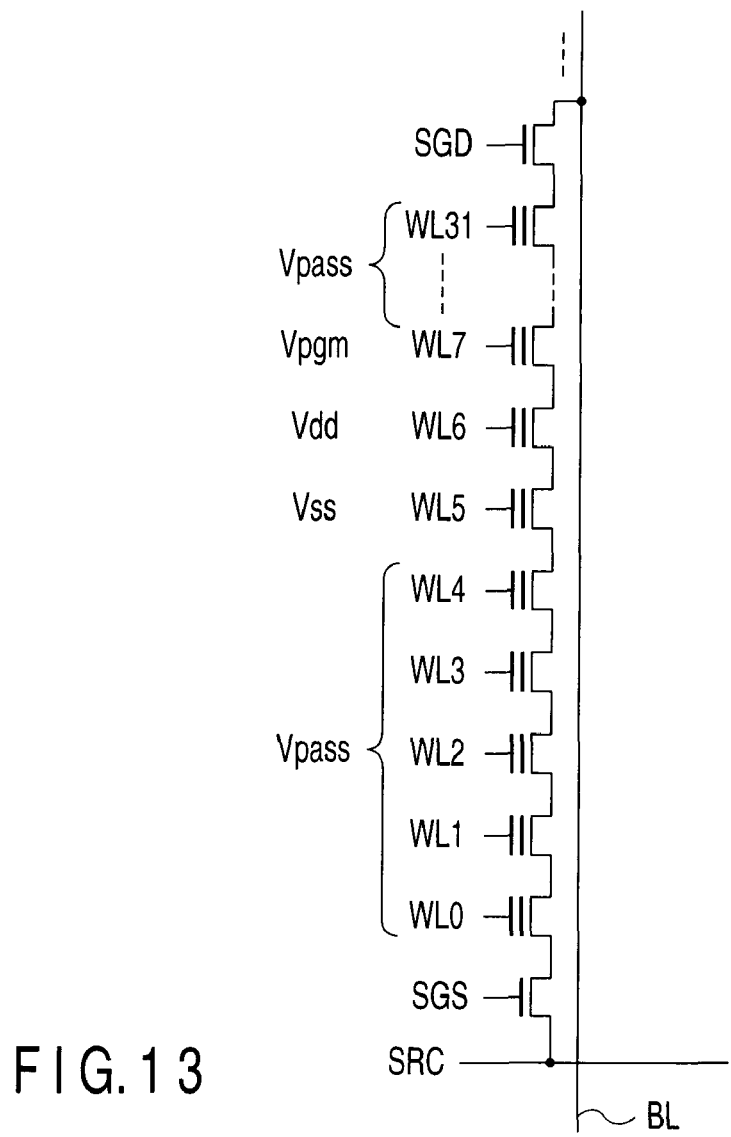
FIG. 13 illustrates an erased area self-boost (EASB) write method.

FIG. 13 illustrates an erased area self-boost (EASB) write method in which an erased area is self-boosted. In the case of the EASB write method, it is necessary to make the threshold voltage distribution of the erase cell shallow. A write operation is executed from the source side of the NAND cell. When data is to be written in the cell, the bit line is set at Vss. In the case of non-write, the bit line is set at Vdd. Next, when data is written in the selected cell by, for instance, a word line WL7, word lines WL0 to WL4 are set at Vpass, WL5 is set at Vss, WL6 is set at Vdd, WL7 is set at program voltage Vpgm, and WL8 to WL31 are set at Vpass. In this state, when data is to be written, data write is executed since the gate of the word line WL7 is set at Vpgm and the channel is set at Vss. In the case of non-write, the channel is boosted at, e.g., Vpass/2. However, in the case where the number of cells in which data is to be written is large, the channel is not easily boosted. In the EASB write method, however, data write is always executed from the source line side. Accordingly, if boost is executed with the word line WL5=0, the channel is boosted since the cells connected to the word lines WL8 to WL31 have been erased, and no data is written. In this manner, the boosted charge is prevented from moving to the already written cells. However, in the case where the cells selected by the word line WL5 are in the erased state and the threshold voltage is at a deep level, that is, at a large negative threshold voltage, the cells are not turned off. It is necessary, therefore, to make the threshold voltage of the erase cell shallow, that is, to set a small negative threshold voltage.

Hence, after the erase operation, all word lines in the block are selected, and program and program verify are executed, and the write operation is carried out up to level "z", as shown in FIG. 7C. In the program and program verify operations at this time, all word lines are selected and the potential of the selected word line at the time of verify is set at z+Vfix (e.g., 0 V). In the other respects, the program and program verify operations are performed in the same manner as ordinary program and program verify operations.

According to the first embodiment, the sub-source lines SRC0e to SRC8ko, which are connected to the main source line SRC, are disposed along the bit lines BL0e to BL8ko. At the time of data read, the sub-source lines SRC0e to SRC8ko are connected to the sources of the NAND cells via the select gate S1. Thus, when the cells are turned on, the charge that is precharged in each bit line can be neutralized with the charge of each sub-source line and main source line and can be erased. Therefore, data can be read at the same time from all the cells connected to the word line.

In addition, at the time of data write, verify read can be executed at the same time for all the memory cells connected to the word line. Therefore, the data write speed can be increased.

Moreover, in the case where a negative threshold voltage is set in the memory cell, when a bias voltage is to be supplied to the source of the memory cell from the constant voltage generating circuit 7-1, a current flowing to the constant voltage generating circuit 7-1 can be suppressed since the charge of each bit line is neutralized with the charge of each sub-source line and main source line and is erased. Therefore, the constant voltage generating circuit 7-1 can stably be operated, and noise can be suppressed.

Second Embodiment

In the first embodiment, the sub-source lines SRC0*e* to SRC8*ko* are disposed along the bit lines BL0*e* to BL8*ko*. In the case where the sub-source lines are disposed adjacent to the bit lines, the distance between each bit line and each sub-source line is decreased and the device fabrication becomes difficult. To cope with this problem, in a second embodiment of the invention, neighboring bit lines and neighboring sub-source lines are disposed in different layers.

Figures 14A, 14B:
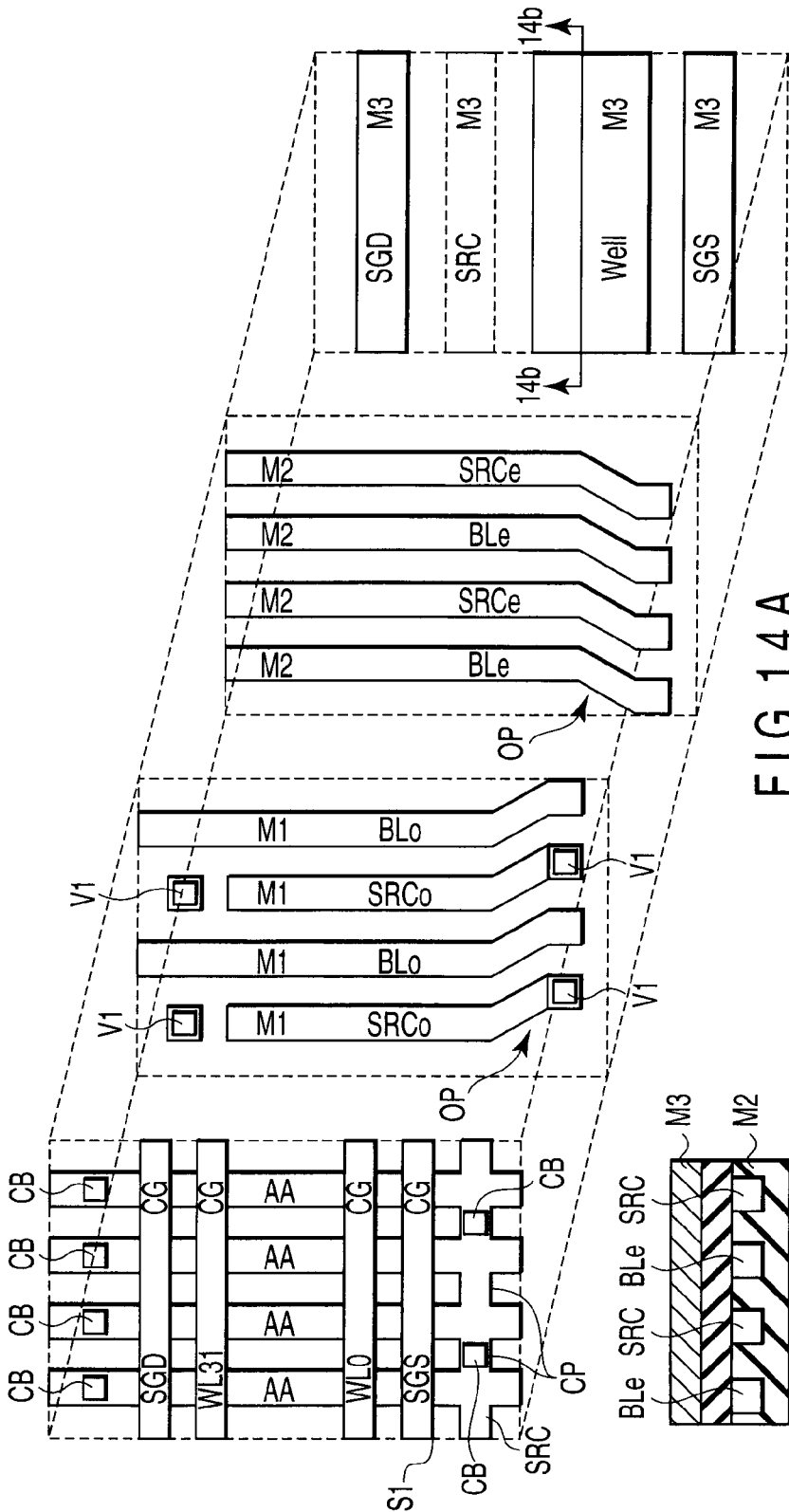
FIGS. 14A and 14B show a second embodiment of the invention, FIG. 14A being an exploded perspective view illustrating the arrangement of bit lines and source lines, and FIG. 14B being a cross-sectional view taken along line 14$b$-14$b$ in FIG. 14A.

FIGS. 14A and 14B show the second embodiment, and schematically illustrate the arrangement of bit lines and source lines. FIGS. 14A and 14B omit depiction of diffusion layers and floating gates of memory cells, interlayer insulation films, etc.

In FIGS. 14A and 14B, floating gates FG, word lines (control gates CG) WL0 to WL31, and select lines SGD and SGS are formed above active areas AA in which diffusion layers are formed. Over these parts, there are provided odd-numbered bit lines BLo of the plural bit lines and odd-numbered sub-source lines SRCo of the plural sub-source lines. The odd-numbered bit lines BLo and odd-numbered sub-source lines SRCo are formed of a first metal wiring layer M1. Even-numbered bit lines BLe and even-numbered sub-source lines SRCe are formed of a second metal wiring layer M2 over the odd-numbered bit lines BLo and sub-source lines SRCo. Select lines SGS and SGD and wiring lines for supplying a potential to the well (Well) are formed of a third metal wiring layer M3 which is disposed over the even-numbered bit lines BLe and sub-source lines SRCe.

Active layers AA are mutually connected at connection portions CP, and thus the sources of the select gates S1 of the respective NAND cells constitute the main source line SRC. Contacts CB are formed, for example, at every other connection portion CP. Via the contacts CB, the odd-numbered sub-source lines SRCo, which are formed above, and source diffusion layers are connected. Vias V1 are formed on the odd-numbered sub-source lines SRCo. The odd-numbered sub-source lines SRCo and even-numbered sub-source lines SRCe are connected through the vias V1. In FIGS. 14A and 14B, the even-numbered bit lines BLe are formed above the odd-numbered sub-source lines SRCo, and the even-numbered sub-source lines SRCe are formed above the odd-numbered bit lines BLo. In this way, the odd-numbered bit lines BLo and even-numbered bit lines BLe, as well as the odd-numbered sub-source lines SRCo and even-numbered sub-source lines SRCe, are disposed in a staggered fashion. Thus, the odd-numbered bit lines BLo and even-numbered bit lines BLe and the odd-numbered sub-source lines SRCo and even-numbered sub-source lines SRCe include oblique patterns OP at positions corresponding to the contacts CB, V1.

According to the second embodiment, the odd-numbered bit lines BLo and sub-source lines SRCo and the even-numbered bit lines BLe and sub-source lines SRCe are disposed in different wiring layers. Therefore, in the structure in which data storage circuits 10 are connected to all bit lines, the bit lines and sub-source lines can be formed with sufficient intervals.

Third Embodiment

In the second embodiment, the neighboring active areas AA are connected by the connection portions CP. On the other hand, in a third embodiment of the invention, the active areas AA are connected without forming connection portions CP.

Figure 16:
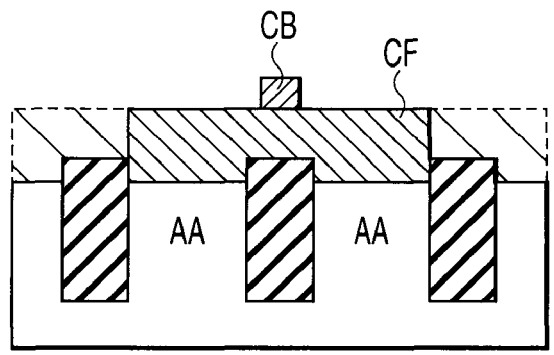
FIG. 16 is a cross-sectional view taken along line 16-16 in FIG. 15A.
Figures 15A, 15B:
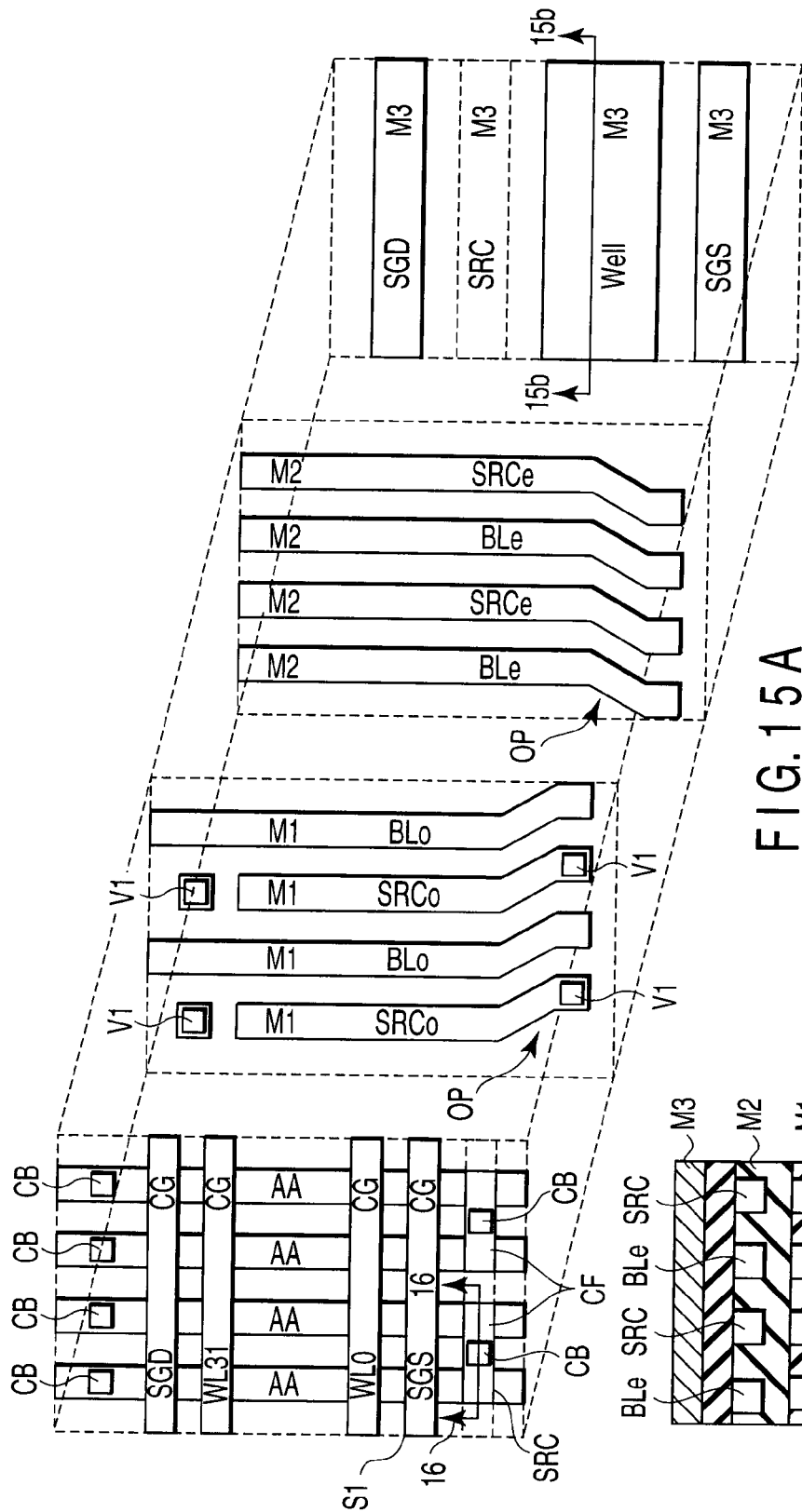
FIGS. 15A and 15B show a third embodiment of the invention, FIG. 15A being an exploded perspective view illustrating the arrangement of bit lines and source lines, and FIG. 15B being a cross-sectional view taken along line 15$b$-15$b$ in FIG. 15A.

In FIGS. 15A, 15B and 16, the same parts as those in FIGS. 14A and 14B are denoted by like reference numbers, and only different parts are described. In FIGS. 15A, 15B and 16, as regards the sources of the select gates S1 of the NAND cells, the neighboring active areas AA are connected by an electrically conductive film CF which is formed of, e.g., polysilicon. The above-described contact CB is formed on an approximately central part of the electrically conductive film CF. The odd-numbered sub-source line SRCo is connected to the contact CB.

According to the third embodiment, the source diffusion layers of the neighboring select gates S1 are connected by the electrically conductive film CF. Therefore, like the second embodiment, the device fabrication can be facilitated in the case where it is difficult to connect the diffusion layers which serve as active areas AA.

Fourth Embodiment

Figure 17A:
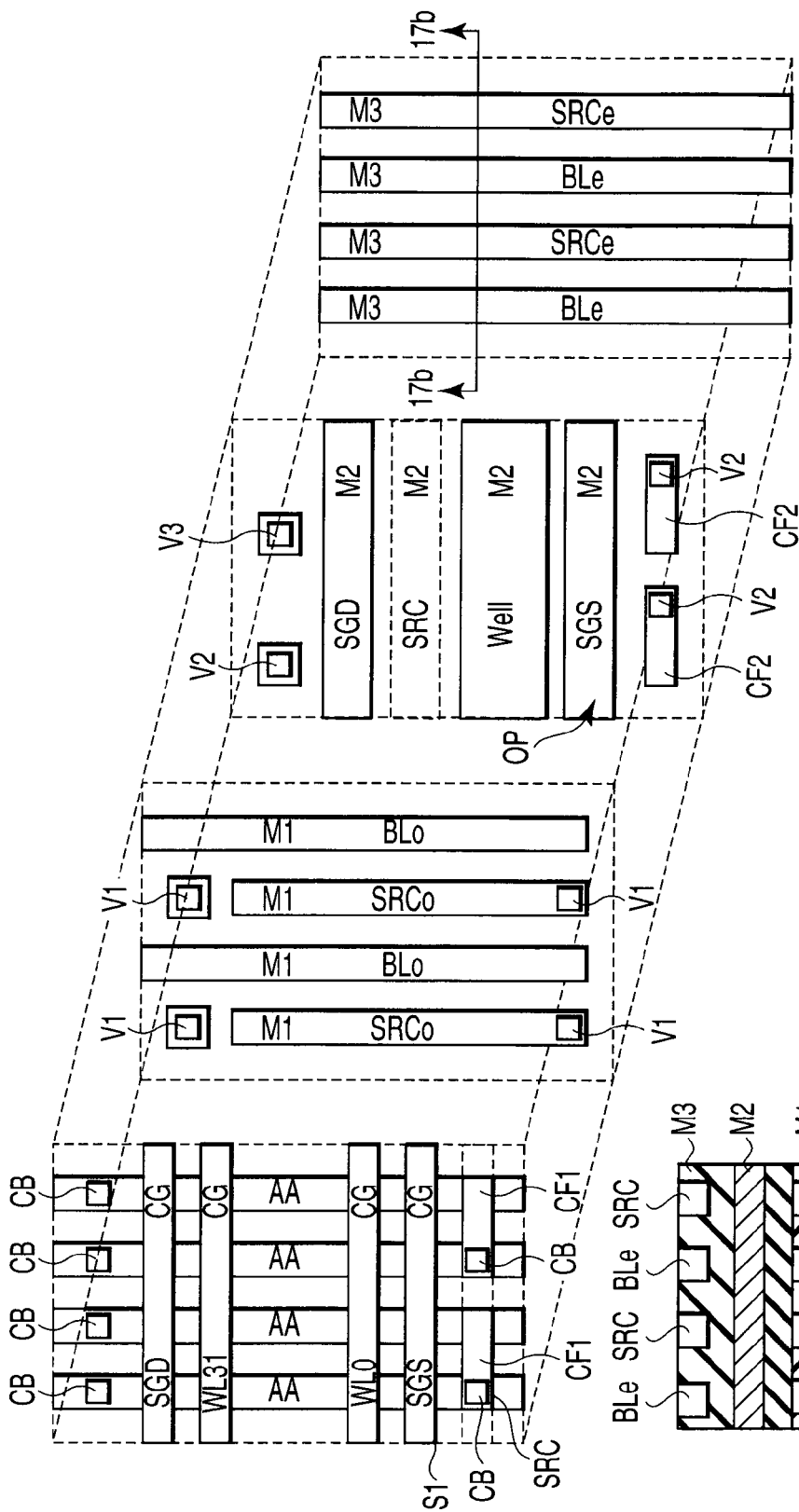
FIGS. 17A and 17B show a fourth embodiment of the invention, FIG. 17A being an exploded perspective view illustrating the arrangement of bit lines and source lines, and FIG. 17B being a cross-sectional view taken along line 17$b$-17$b$ in FIG. 17A.
Figure 17B:
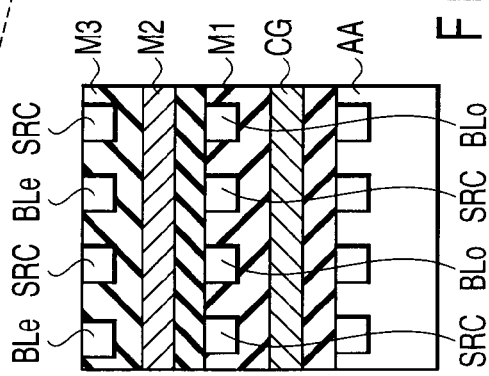

FIGS. 17A and 17B show a fourth embodiment of the present invention. The same parts as those in FIGS. 15A, 15B and 16 are denoted by like reference numbers.

In the second and third embodiments, the odd-numbered bit lines BLo and even-numbered bit lines BLe, as well as the odd-numbered sub-source lines SRCo and even-numbered sub-source lines SRCe, include the oblique patterns OP. On the other hand, in the fourth embodiment, the odd-numbered bit lines BLo and even-numbered bit lines BLe, as well as the odd-numbered sub-source lines SRCo and even-numbered sub-source lines SRCe, are formed of only straight patterns.

Specifically, as shown in FIGS. 17A and 17B, as regards the sources of the select gates S1 of the NAND cells, the neighboring active areas AA are connected by a first electrically conductive film CF1 which is formed of, e.g., polysilicon. A contact CB is formed on the first electrically conductive film CF1 at a position corresponding to one of the neighboring active areas AA that are connected by the first electrically conductive film CF1. The odd-numbered sub-source line SRCo is connected to this contact CB. Thus, the odd-numbered sub-source lines SRCo are formed of only straight patterns, and the odd-numbered bit lines BLo are also formed of only straight patterns.

In addition, vias V1 are formed on the odd-numbered sub-source lines SRCo, and second electrically conductive films CF2 are formed of second metal wiring layers on the vias V1. In the second and third embodiments, the second metal wiring layer M2 constitutes the even-numbered bit lines and sub-source lines. In the fourth embodiment, the second metal wiring layer M2 constitutes the select lines SGD and SGS and the well (Well). Vias V2 are formed on the second electrically conductive films CF2 at positions corresponding to the even-numbered sub-source lines SRCe. The odd-numbered sub-source lines SRCo and even-numbered sub-source lines SRCe are connected via the vias V2, second electrically conductive films CF2 and vias V1. Specifically, the even-numbered sub-source lines SRCe and even-numbered bit lines BLe are formed of the third metal wiring layer M3.

According to the fourth embodiment, the active areas AA, odd-numbered sub-source lines SRCo and even-numbered sub-source lines SRCe are connected by using the first and second electrically conductive films CF1 and CF2, the contacts CB and the vias V1 and V2. Thereby, the odd-numbered sub-source lines SRCo and odd-numbered bit lines BLo, as well as even-numbered sub-source lines SRCe and even-numbered bit lines BLe, can be formed of only straight patterns. Without using special exposure techniques, fine patterns can easily be formed.

The electrically conductive films CF, first electrically conductive films CF1 and second electrically conductive films CF2 are formed partly at positions corresponding to the neighboring active areas AA. Alternatively, these conductive films may be formed integral, for example, as indicated by broken lines in FIGS. 15, 16 and 17.

In FIGS. 14 and 15, the select lines SGD and SGS and the well (Well) are formed in the third metal wiring layer M3. In FIG. 17, the select lines SGD and SGS and the well (Well) are formed in the second metal wiring layer M2. Alternatively, the source line SRC may be formed in addition to the select lines SGD and SGS and the well (Well) in the third metal wiring layer M3 shown in FIGS. 14 and 15, as indicated by broken lines, and in the second metal wiring layer M2 shown in FIG. 17, as indicated by a broken line. The source line SRC and sub-source lines SRCe and SRCo may be connected through vias (not shown).

Besides, in the first to fourth embodiments, the semiconductor memory devices, which store 4-value data, have been described by way of example. The invention is not limited to these examples, and is applicable to semiconductor memory devices which store 8-value data, 16-value data, or n-value (n: natural number) data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which a plurality of NAND cells are arranged, each of the plurality of NAND cells including a plurality of series-connected memory cells, the plurality of NAND cells having drains connected to a plurality of bit lines, respectively, and the plurality of memory cells having gate electrodes connected to word lines, respectively; and
   a plurality of source lines, each of the plurality of source lines disposed along a respective one of the plurality of bit lines, and the plurality of source lines being connected respectively to sources of the plurality of NAND cells at a time of data read.

2. The device according to claim 1, wherein the plurality of source lines discharge charges of associated ones of the plurality of bit lines.

3. The device according to claim 1, further comprising a main source line which is connected to the plurality of source lines; and
   a voltage generating circuit which supplies a fixed voltage to the main source line at a time of data read.

4. The device according to claim 1, further comprising a data storage circuit which is connected to each of the bit lines.

5. The device according to claim 1, wherein the plurality of bit lines include first and second bit lines,
   the plurality of source lines include first and second source lines, and
   the first source lines and the first bit lines are disposed in a first layer, and the second source lines and the second bit lines are disposed in a second layer which is different from the first layer.

6. The device according to claim 5, further comprising:
   a plurality of active layers serving as sources of select gates formed in a substrate;
   an electrically conductive layer which connects the plurality of active layers; and
   a contact formed at a central portion of the electrically conductive layer, the contact connecting each of oblique patterns included in the first and second source lines and the electrically conductive layer.

7. The device according to claim 5, further comprising:
   a plurality of active layers serving as sources of select gates formed in a substrate;
   an electrically conductive layer which connects the plurality of active layers; and
   contacts provided at positions on the electrically conductive layer, which correspond to the plurality of active layers, the contacts connecting the first source lines and the electrically conductive layer.

* * * * *